(12) United States Patent
Mahrt et al.

(10) Patent No.: US 8,718,112 B2
(45) Date of Patent: May 6, 2014

(54) RADIAL BRAGG RING RESONATOR STRUCTURE WITH HIGH QUALITY FACTOR

(75) Inventors: Rainer F. Mahrt, Meilen (CH); Nikolaj Moll, Zurich (CH); Sophie Schoenenberger, Zurich (CH); Thilo Hermann Curt Stoferle, Zurich (CH)

(73) Assignee: International Business Machines Corporation, Armonk, NY (US)

( * ) Notice: Subject to any disclaimer, the term of this patent is extended or adjusted under 35 U.S.C. 154(b) by 772 days.

(21) Appl. No.: 12/249,271

(22) Filed: Oct. 10, 2008

(65) Prior Publication Data

US 2010/0091370 A1    Apr. 15, 2010

(51) Int. Cl.
*H01S 3/083* (2006.01)
*G02B 6/10* (2006.01)
*G02F 1/295* (2006.01)

(52) U.S. Cl.
USPC ............. 372/94; 385/132; 385/10; 385/37; 359/578

(58) Field of Classification Search
USPC ........... 359/578; 385/37, 132, 14, 10; 372/94, 372/6, 102
See application file for complete search history.

(56) References Cited

U.S. PATENT DOCUMENTS

| | | | |
|---|---|---|---|
| 5,187,461 A | 2/1993 | Brommer et al. | |
| 6,909,729 B2 * | 6/2005 | Ibanescu et al. | 372/6 |
| 7,099,549 B2 * | 8/2006 | Scheuer et al. | 385/132 |
| 2007/0153860 A1 * | 7/2007 | Chang-Hasnain et al. | 372/50.124 |

* cited by examiner

*Primary Examiner* — Audrey Y Chang
(74) *Attorney, Agent, or Firm* — Cantor Colburn LLP; Daniel Morris (57) ABSTRACT

A high quality factor optical resonator structure includes a substrate, a center disc formed on the substrate, and a plurality of concentric grating rings surrounding the center disc. The concentric rings are spaced apart from the center disc and from one another by regions of lower index of refraction material with respect thereto, and wherein spacing between the grating rings and the center disc is non-periodic such that a magnitude of a displacement distance of a given grating ring with respect to a $\lambda/4$ Bragg reflector geometry is largest for a first of the grating rings immediately adjacent the center disk and decreases in a radially outward direction.

18 Claims, 6 Drawing Sheets

RADIAL BRAGG RING RESONATOR STRUCTURE WITH HIGH QUALITY FACTOR

BACKGROUND

The present invention relates generally to optical resonator devices and, more particularly, to a radial Bragg ring resonator structure with a high quality factor, Q.

Optical resonators comprise the central components of light source devices such as, for example, high-efficiency light emitting diodes, lasers, switches, and filters. In the field of computing, multi-core microprocessor architectures have been developed in order to mitigate increased power dissipation in high-performance computer chips. However, the bandwidth limitations for global electrical interconnections between various cores are rapidly becoming the major factor in restricting further scaling of total chip performance. One approach to resolving this interconnect bottleneck is to transmit and route signals in the optical domain, since optical signals can provide both immense aggregate bandwidth and large savings in on-chip dissipated power. As such, optical resonators are desirably integrated with integrated circuit (IC) device substrates. In fact, the field of integrated optics has expanded tremendously in recent years, and integrated optical device solutions are now being proposed for applications in a variety of fields including, for example, telecommunications, data communications, high performance computing, biological and chemical sensing, and radio frequency (RF) networks.

Specific solutions for optical resonators that are may be integrated on planar substrates (e.g., silicon) include structures such as, for example, linear resonators with distributed Bragg reflector mirrors, individual ring or disc resonators, photonic crystals and radial Bragg ring resonators. In particular, radial Bragg ring resonators, which are also known as circular grating resonators (CGRs) or "fingerprint" structures, have more recently been considered for applications in integrated optics such as lasing and all-optical switching. Radial Bragg ring resonators have a very small footprint of a few micrometers, which essentially corresponds to the smallest optical resonators possible. Thus, even at relatively low refractive index contrasts, radial Bragg ring resonators offer full two-dimensional light confinement, making them a very attractive candidate for future integrated photonic devices since they may be fabricated of any transparent (low absorption) material.

Two of the primary parameters of interest for optical resonators having a resonance at a certain wavelength are the quality factor, Q, and the effective mode volume, $V_{eff}$. With respect to both linear resonators having distributed Bragg reflector mirrors and disc resonators, a primary disadvantage thereof is the large mode volume of those resonators, wherein $V_{eff}$ is on the order of hundreds of times the operating wavelength of light cubed ($\lambda^3$). This in turn leads to low optical confinement, prevents dense areal integration and requires relatively high power to drive optically active material inside the optical resonator. Furthermore, integrated devices which harness cavity quantum electrodynamic effects such as the Smith-Purcell effect (e.g., single-photon sources) or the photon blockade regime (e.g., single-photon switches) are not possible as they require a large ratio of $Q/V_{eff}$.

With respect to photonic crystals, the primary drawback of this type of resonator is that it requires a large refractive index contrast between the material of the photonic crystal (such as GaAs or Si) and the surrounding material (such as air) in order to achieve a complete two-dimensional bandgap. This limits their use in terms of wavelengths (infrared), fabrication (suspended membranes) and materials (i.e., semiconductor materials which are not back end of line (BEOL)-compatible in their crystalline form).

In addition, the aforementioned linear resonators having distributed Bragg reflector mirrors, disc resonators, and photonic crystals all share the disadvantage that resonator modes with a dipole-like mode profile are not known. This, however, is required for optimum coupling to (for example) molecules, nanoparticles and quantum dots, which are potentially located in the resonator serving as absorbing, emitting or non-linear material. Finally, a primary drawback of conventionally designed radial Bragg ring resonator is the low quality factor Q (e.g., <10000) for devices having small mode volumes (e.g., on the order of a few $\lambda^3$), which is caused by large vertical or out-of-plane losses.

SUMMARY

In an exemplary embodiment, an optical resonator structure includes a substrate; a center disc formed on the substrate; a plurality of concentric grating rings surrounding the center disc, the concentric rings spaced apart from the center disc and from one another by regions of lower index of refraction material with respect thereto; and wherein spacing between the grating rings and the center disc is non-periodic such that a magnitude of a displacement distance of a given grating ring with respect to a $\lambda/4$ Bragg reflector geometry is largest for a first of the grating rings immediately adjacent the center disk and decreases in a radially outward direction.

In another embodiment, a method of forming an optical resonator structure includes forming a center disc formed on a substrate; forming a plurality of concentric grating rings surrounding the center disc, the concentric rings spaced apart from the center disc and from one another by regions of lower index of refraction material with respect thereto; and wherein spacing between the grating rings and the center disc is non-periodic such that a magnitude of a displacement distance of a given grating ring with respect to a $\lambda/4$ Bragg reflector geometry is largest for a first of the grating rings immediately adjacent the center disk and decreases in a radially outward direction.

BRIEF DESCRIPTION OF THE SEVERAL VIEWS OF THE DRAWINGS

Referring to the exemplary drawings wherein like elements are numbered alike in the several Figures.

DETAILED DESCRIPTION

Disclosed herein is an optical resonator having both a very high quality factor Q (e.g., >10000) and a very small effective mode volume $V_{eff}$ (on the order of a few $\lambda^3$). Briefly stated, the optical resonator embodiments include a center disc (e.g., circular or oval) and surrounding concentric, non-periodic gratings (e.g., circular or oval) which serve as radial Bragg reflectors. The spacing between the gratings and their widths are chosen appropriately such that the "mirror-like" effect nearest the central region is reduced. Although this adjustment with respect to ideal $\lambda/4$ reflectors results in a slight increase in $V_{eff}$, there is also a dramatic increase in Q (e.g., by up to 3 orders of magnitude) due to much smaller vertical losses as compared to conventional radial Bragg ring resonators. In addition, the disclosed resonator embodiments do not require a high-index contrast between the materials, and dipole-like mode profiles may be realized.

Figure 1:
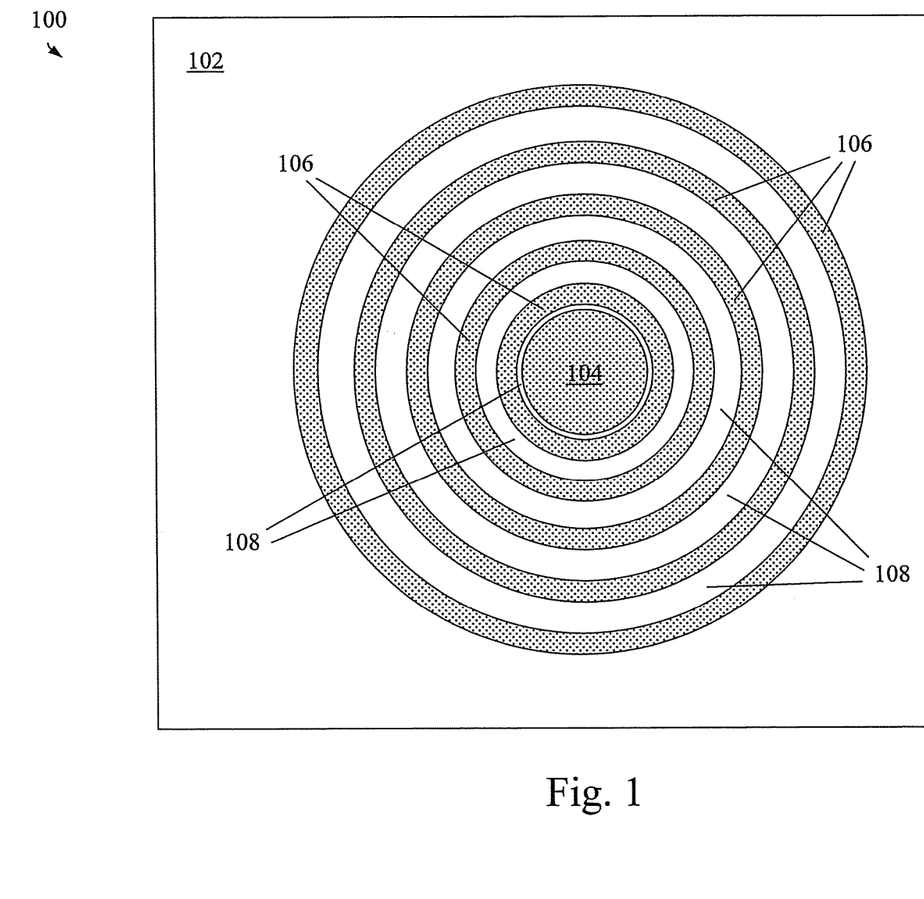
FIG. 1 is a top view of a radial Bragg ring resonator structure configured in accordance with an embodiment of the invention.

Referring initially to FIG. 1, there is shown a top view of a radial Bragg ring resonator structure 100 configured in accordance with an embodiment of the invention. The structure 100 includes a substrate 102, such as silicon dioxide ($SiO_2$) or silicon dioxide on silicon (silicon-on-insulator technology), for example. A center disc 104 (e.g., Si, GaAs, InP, ZnO, $TiO_2$, $Ta_2O_5$, $HfO_2$, $Al_2O_3$, diamond) is formed on the substrate 102, and may be circular or oval in shape for example. The center disc 104 is concentrically surrounded by a plurality of grating rings (i.e., Bragg gratings) 106 that are spaced apart from the center disc 104 and from one another by regions 108 of lower index material, such as air. Alternatively, the rings may be encapsulated in a transparent cladding material such as silicon oxide ($SiO_2$), or polymethyl (meth)acrylate (PMMA). In any event, the grating rings 106 have a higher index of refraction with respect to the surrounding in-plane material (e.g., air), and the grating rings 106 may, but need not be formed from the same material as the center disc 104 (e.g., Si, GaAs, InP, ZnO, $TiO_2$, $Ta_2O_5$, $HfO_2$, $Al_2O_3$, diamond). Moreover, the index contrast between the material of the grating rings 106 and the surrounding regions can be small, e.g., using tantalum oxide ($Ta_2O_5$) (n=2.1) or silicon (Si) (n=3.4) for the grating rings 106 and silicon dioxide ($SiO_2$) (n=1.46) or air (n=1) for the surrounding.

With certain existing radial Bragg ring resonator structures, the number, period and the width of the individual grating rings 106 are designed so as to achieve a high reflectivity to minimize the $V_{eff}$. The period and/or refractive index of the annular reflectors are mathematically adjusted such that they act as equivalent $\lambda/4$ reflectors (or some multiple thereof) and maximize light confinement at the centermost region of the resonator device. However, as indicated above, such resonator structures have a low quality factor Q because of the strong localization of the optical mode near the central region, which involves high vertical (out-of-plane) scattering losses.

Accordingly, the structure 100 of FIG. 1 overcomes this disadvantage by having the spacing or period between the center disc 104 and between adjacent grating rings 106 deviated from an "unperturbed," ideal $\lambda/4$ geometry. The degree of this deviation is largest for the first ring nearest the center, and exponentially decreases in the radially outward direction. (In other embodiments as described in further detail below, this may be achieved by appropriately changing the period and/or the width of the grating rings.) In so doing, the otherwise strong localization proximate the center of the structure is relaxed, which leads to a decrease in the vertical losses (out-of-plane) of the resonator device. Although a result of this geometry is a slightly larger $V_{eff}$ (e.g., increased by less than a factor of 2), for most applications this is tremendously outweighed by a substantial increase in the quality factor (e.g., up to three orders of magnitude, depending on the materials used for the grating rings and the surrounding).

Another aspect of the present embodiments is that due to the cylindrical symmetry, azimuthal orders, m, of zero or higher may be used. Hence, the spatial field profile can be fully circular symmetric (m=0), dipole-like (m=1) or multipole-like (m>1). For circular (not oval) configurations, the radius $r_0$ of the center disc 104 determines the resonance frequency $\omega_{res}$ of the resonator. The radii of "unperturbed" Bragg rings $r_{unperturbed}$ may be calculated, for example, according to U.S. Pat. No. 7,099,549, the contents of which are incorporated herein in their entirety. As indicated above, the displacement distance, $\Delta$, from each of the corresponding "unperturbed" or $\lambda/4$ Bragg rings decreases from the center to the outer region. In an exemplary embodiment, the displacement distance of each Bragg grating ring 106 from the unperturbed location depends on the Bragg ring number "p," and in accordance with the following expression:

$$\Delta(p) = \Delta(p=1) * \eta^{(p-1)}; \quad \text{(Eq. 1)}$$

wherein $\eta$ is a constant having a value between 0 and 1. With respect to the resonator structure 100 in FIG. 1, Bragg ring 1 corresponds to the ring 106 immediately surrounding the center disc 104, ring 2 is the ring immediately surrounding ring 1, and so on. Initially selected values of $\Delta(p=1)$ and the scaling factor $\eta$ are different for each resonator configuration, depending upon (for example) thickness, index contrast, azimuthal order "m", and central radius. For an unperturbed ring width of w(p) the inner radius is given by:

$$r_{inner}(p) = r_{unperturbed}(p) + \Delta(p) - w(p)/2 \quad \text{(Eq. 2)}$$

and the outer radius is given by:

$$r_{outer}(p) = r_{unperturbed}(p) - \Delta(p) + w(p)/2. \quad \text{(Eq. 3)}$$

For large values of p, $\Delta(p)$ decreases exponentially, and thus the grating rings furthest from the center become periodic; i.e., $r_{unperturbed}(p+1) = r_{unperturbed}(p) + a$, where "a" is the periodicity of the gratings.

Figure 2:
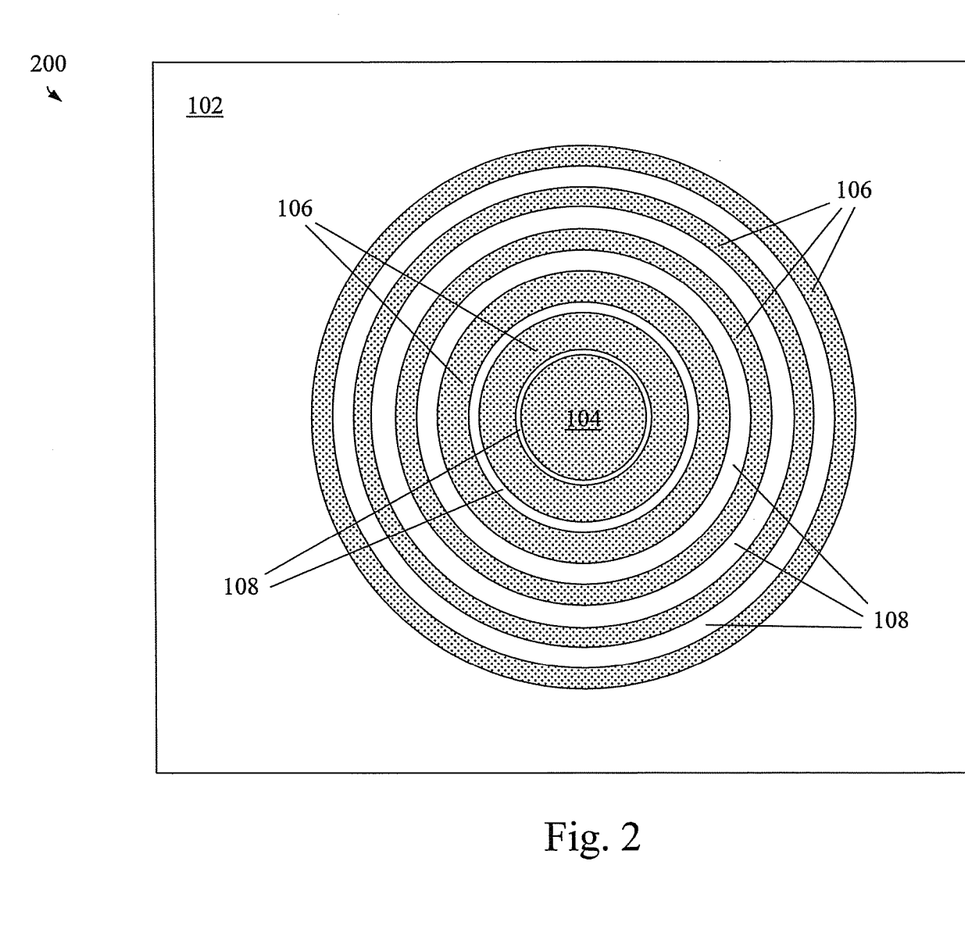
FIG. 2 is a top view of a radial Bragg ring resonator structure configured in accordance with an alternative embodiment of the invention.

In the exemplary embodiment of FIG. 1, the high-Q resonator structure 100 features non-uniform grating ring spacing distances with constant widths of the circular (or oval) Bragg rings. By way of comparison, FIG. 2 is a top view of a radial Bragg ring resonator structure 200 configured in accordance with an alternative embodiment of the invention. In this embodiment, it will be noted that the resonator structure 200 has both a non-uniform spacing distance between grating rings 106 and non-uniform widths of the rings themselves.

Figure 3:
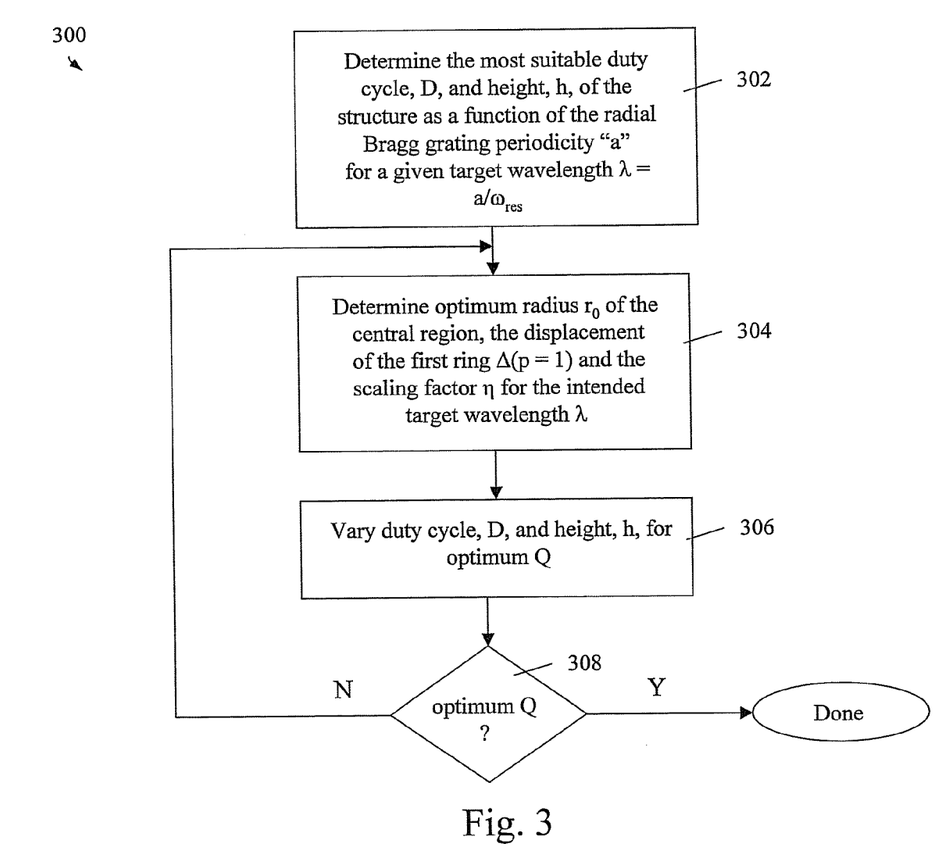
FIG. 3 is a flow diagram illustrating a method 300 of designing a high-Q radial Bragg ring resonator in accordance with a further embodiment of the invention.
Figure 4:
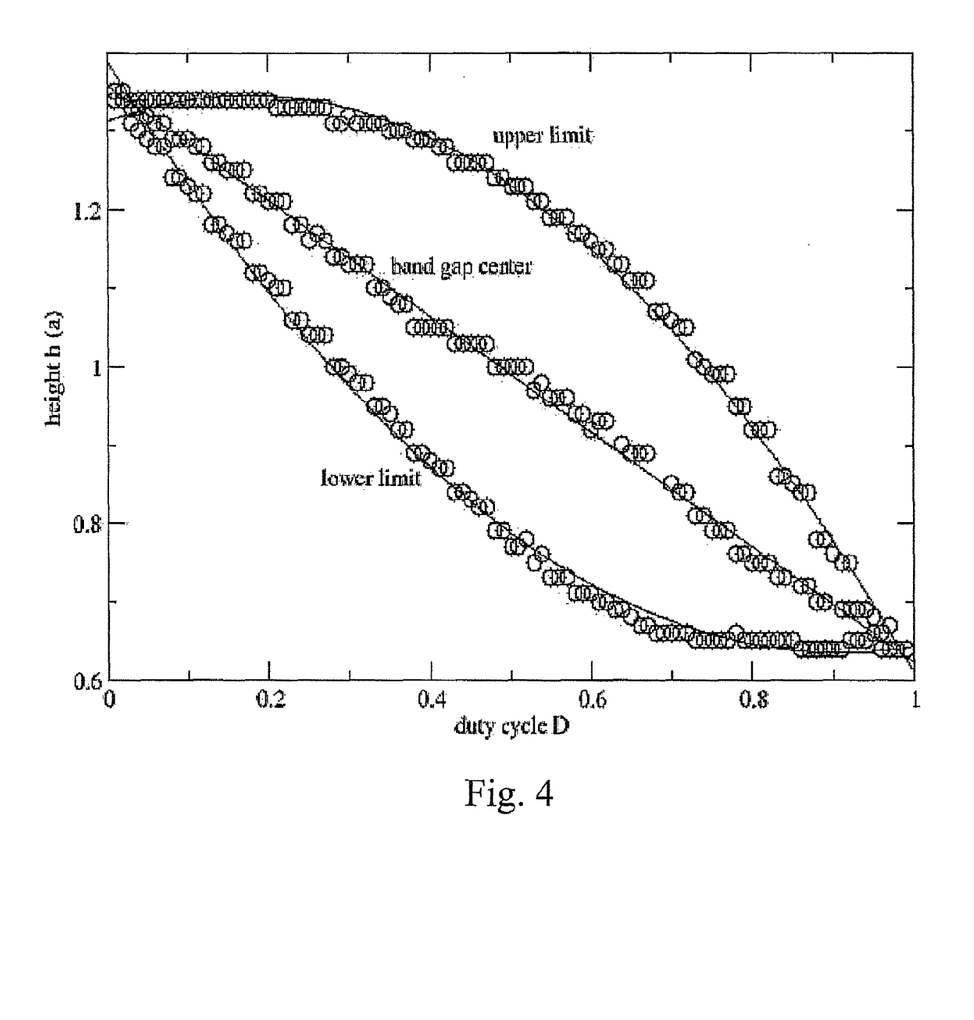
FIG. 4 is a graph that plots possible resonator configurations for the azimuthal order m=1 as a function of height and duty cycle.

Referring now to FIG. 3, there is shown a flow diagram illustrating a method 300 of designing a high-Q radial Bragg ring resonator in accordance with a further embodiment of the invention. As shown in block 302, a duty cycle, D, and a height, h, of the resonator structure is determined as a function of the radial Bragg grating periodicity "a" for a given target wavelength $\lambda = a/\omega_{res}$ (wherein $\omega_{res}$ is the resonance frequency of the resonator in units of c/a, where c is the speed of light). The calculations may be performed by solving Maxwell's equations in the frequency domain. The results for some exemplary configurations are illustrated in FIG. 4, which is a graph that plots possible configurations for the azimuthal order m=1 as a function of the height, h, and the duty cycle, D, (defined as a ratio between width of the surrounding material between the gratings and periodicity "a"). The height, h, is normalized to the periodicity a. The upper and the lower limits in FIG. 4 correspond to the configurations where the intended resonance frequency of the cavity $\omega_{res}$ is no longer inside the photonic bandgap of the radial Bragg rings. The configurations with the highest Q are those where $\omega_{res}$ is near the center of the bandgap, i.e., on the center line labeled "band gap center." In the example depicted, the plot is suitable for Bragg rings made of Si (n=3.4) and where the surrounding is SiO$_2$ (n=1.46).

Referring again to FIG. 3, as shown in block 304, an optimum radius $r_0$ of the central region, the displacement of the first ring $\Delta(p=1)$ and the scaling factor $\eta$ for the intended target wavelength $\lambda$ are then determined. This may be done by solving Maxwell's equations in the time domain and calculating the Q factor of the optical resonator. After an initial guess for all three parameters, they are iteratively altered in order to achieve the maximum Q. For example, as shown in block 306 the duty cycle and height of the structure are varied to optimize Q. If at decision block 308, the Q is not yet optimized, then blocks 304 and 306 are repeated until the Q is optimized and the process exits. Alternatively, this optimization may be done using one or a combination of several algorithms, e.g., Monte Carlo, genetic algorithms and the like. Additionally, the widths of the radial Bragg rings may be changed ring-by-ring in order to further increase Q.

Figure 5:
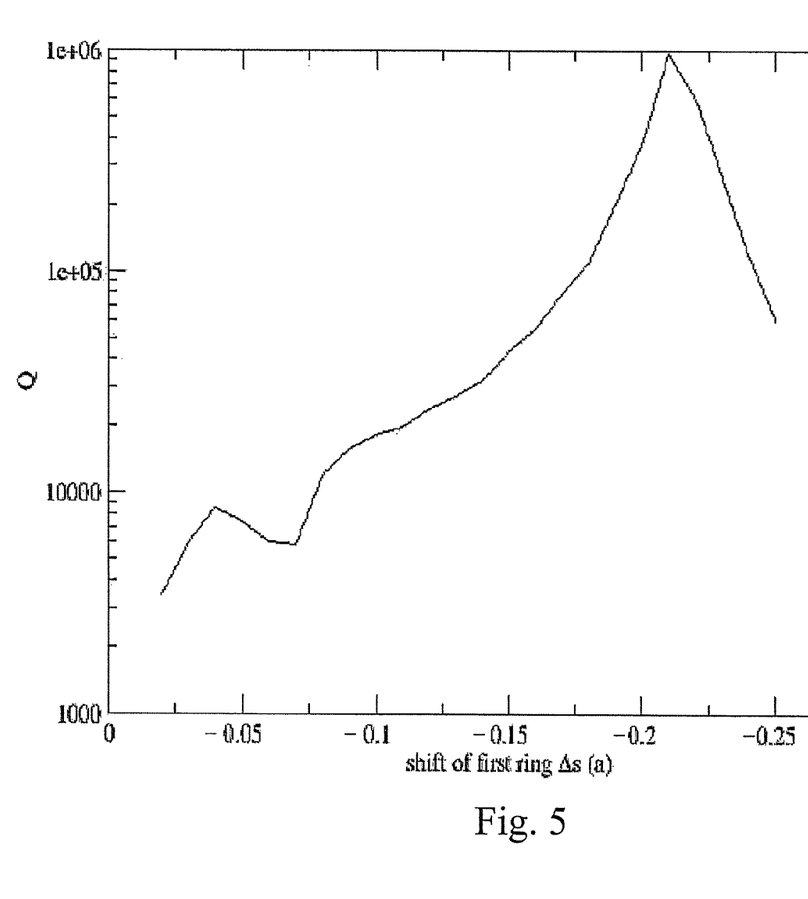
FIG. 5 is a graph that plots the quality factor Q of an exemplary radial Bragg ring resonator as a function of the shift of the first ring.
Figure 6:
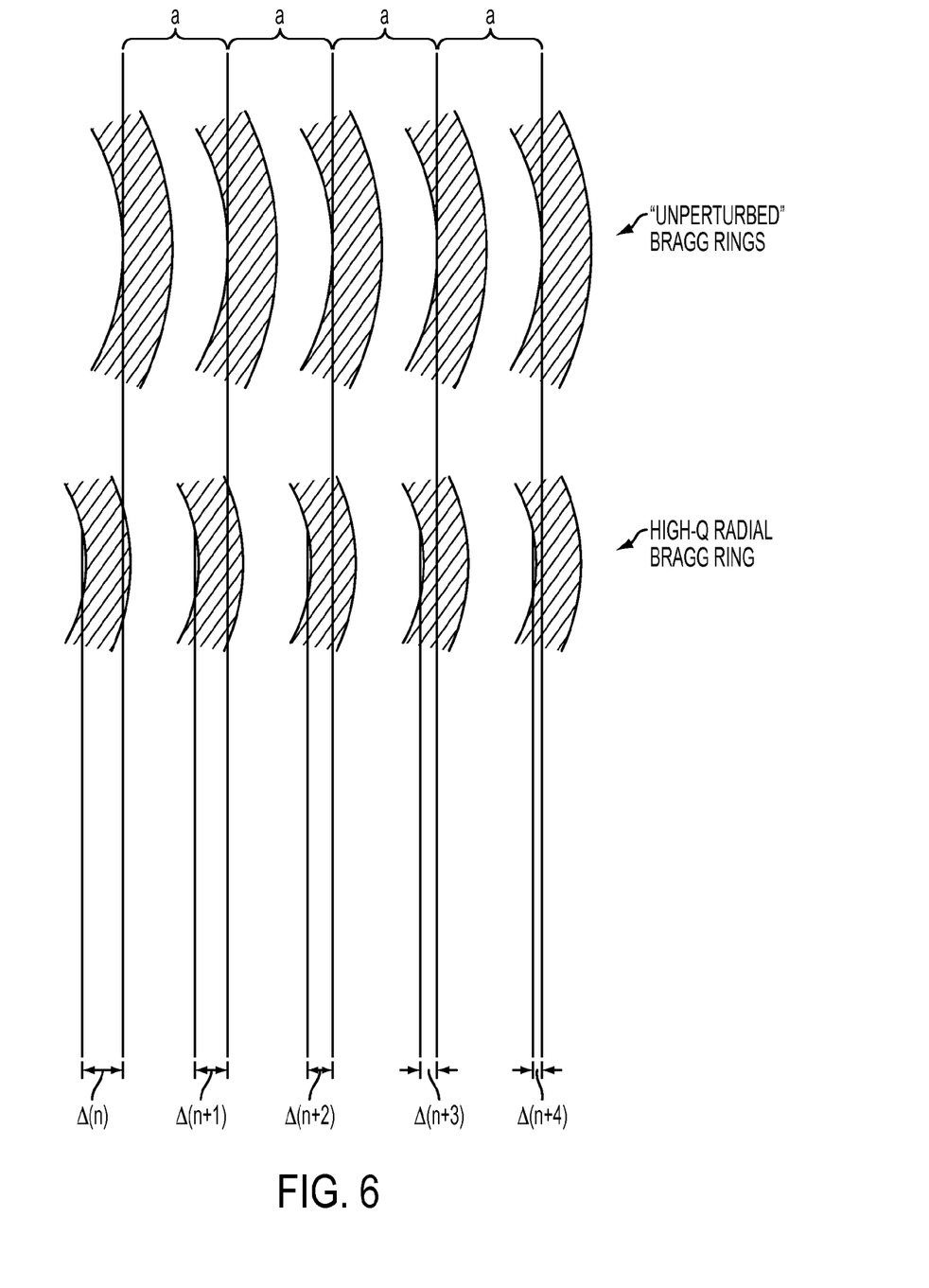
FIG. 6 shows a spatial correspondence between unperturbed Bragg rings and the Bragg rings the radial Bragg ring resonator structure of the present invention.

Finally, FIG. 5 is a graph that plots the quality factor Q of the radial Bragg ring resonator as a function of the shift $\Delta s$ of the first ring (p=1), $\Delta s = -\Delta(p=1)$, in units of the periodicity, a. The parameters are the same as in FIG. 4, with the duty cycle D=0.33 and the height h=1.12*a. The radius of the center disc is $r_0$=1.62*a, and the scale factor is $\eta$=0.85. From the plot in FIG. 5, an exemplary optimum displacement of the first grating $\Delta(p=1)$ toward the center (with respect to an unperturbed $\lambda$/4 device) is -0.21*a, which results in Q=1.0×10$^6$ and a mode volume of 9.9*a$^3$ at $\omega_{res}$=0.182 (the resonant wavelength is then $\lambda$=a/$\omega_{res}$).

As will thus be appreciated, the present resonator embodiments differ from those structures that seek to attain optimum confinement of the optical mode inside the resonator. Such devices would only be ideal for an imaginary, vertically infinitely extended radial Bragg ring resonator with no vertical losses. However, for realistic devices which have a finite thickness (and are, for example, built on top of a substrate), the performance of ideal $\lambda$/4 reflectors or equivalent $\lambda$/4 reflectors will be dominated by vertical scattering losses, and therefore such resonators will suffer from having a low quality factor Q. In contrast, the present embodiments are directed to reducing vertical losses in practical devices with finite heights (thicknesses) by slightly relaxing $V_{\mathit{eff}}$, and in so doing, produce a significant increase in the Q-factor of the resonator.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. An optical resonator structure, comprising:
   a substrate;
   a center disc formed on the substrate; and
   a plurality of perturbed concentric grating rings surrounding the center disc, the perturbed concentric rings spaced apart from the center disc and from one another by regions of lower index of refraction material with respect thereto;
   wherein spacing between an inner most of the perturbed grating rings and the center disc, and spacing between adjacent pairs of perturbed grating rings is non-periodic and a displacement distance-$\Delta$ of a given perturbed grating ring towards the center disc with respect to a corresponding unperturbed ring of an unperturbed concentric ring geometry having periodically spaced gratings with periodicity, a, is largest for the inner most of the grating rings immediately adjacent the center disk and decreases for each subsequently radially-outward grating ring.

2. The optical resonator structure of claim 1, wherein the displacement distance $\Delta$ decreases exponentially for each subsequently radially-outward grating ring.

3. The optical resonator structure of claim 2, wherein the displacement distance $\Delta$ for the given grating ring with respect to the corresponding ring of the unperturbed concentric ring geometry is given by the following expression:

$$\Delta(p) = \Delta(p=1) * \eta^{(p-1)};$$

wherein p corresponds to the Bragg grating ring number counting radially outward from the center disc, and $\eta$ is a constant scaling factor between 0 and 1.

4. The optical resonator structure of claim 1, wherein the center disc and grating rings have one of a circular and an oval shape.

5. The optical resonator structure of claim 1, wherein the concentric grating rings have the same width.

6. The optical resonator structure of claim 1, wherein the concentric grating rings have different widths.

7. The optical resonator structure of claim 1, wherein the concentric grating rings comprises one or more of silicon (Si), gallium arsenide (GaAs), indium phosphide (InP), zirconium oxide (ZnO), titanium oxide (TiO$_2$), tantalum oxide (Ta$_2$O$_5$), hafnium oxide (HfO$_2$), aluminum oxide (Al$_2$O$_3$) and diamond.

8. The optical resonator structure of claim 7, wherein the regions of lower index of refraction material comprise one or more of silicon dioxide (SiO$_2$), polymethyl (meth)acrylate (PMMA) and air.

9. A method of forming an optical resonator structure, the method comprising:
   forming a center disc on a substrate; and
   forming a plurality of perturbed concentric grating rings surrounding the center disc, the perturbed concentric rings spaced apart from the center disc and from one another by regions of lower index of refraction material with respect thereto;
   wherein spacing between an inner most of the perturbed grating rings and the center disc, and spacing between adjacent pairs of perturbed grating rings is non-periodic and a displacement distance $\Delta$ of a given perturbed grating ring towards the center disc with respect to a corresponding unperturbed ring of an unperturbed concentric ring geometry having periodically spaced gratings with periodicity, a, is largest for the inner most of the grating rings immediately adjacent the center disk and decreases for each subsequently radially-outward grating ring.

10. The method of claim 9, wherein the displacement distance $\Delta$ decreases exponentially for each subsequently radially-outward grating ring.

11. The method of claim 10, wherein the displacement distance $\Delta$ for the given grating ring with respect to the corresponding ring of the unperturbed in the comparative periodic, concentric ring geometry is given by the following expression:

$$\Delta(p) = \Delta(p=1) * \eta^{(P-1)};$$

wherein p corresponds to the Bragg grating ring number counting radially outward from the center disc, and η is a constant scaling factor between 0 and 1.

12. The method of claim 11, further comprising determining a duty cycle, D, and a height, h, of the resonator structure as a function of the periodic, concentric ring geometry periodicity, a, for a given target wavelength of operation $\lambda=c/v_{res}=c/(f_{res} c/a)$, wherein $v_{res}$ is the resonance frequency of the resonator in units of seconds$^{-i}$, c is the speed of light, and $f_{res}$ is the dimensionless resonance frequency rescaled by c/a, and where the duty cycle D is a ratio between the width of the regions of lower index of refraction material between the grating rings and the periodicity a.

13. The method of claim 12, wherein the radius $r_0$ of the center disc, the displacement of the first grating ring $\Delta(p=1)$ and the scaling factor η for the intended target wavelength of operation are determined initially estimating values of $r_0$, $\Delta(p=1)$ and η, calculating an initial quality factor (Q) value based on the initially estimated values, followed by iteratively altering values of $r_0$, $\Delta(p=1)$ and η, until a maximum Q value is determined.

14. The method of claim 9, wherein the center disc and grating rings have one of a circular and an oval shape.

15. The method of claim 9, wherein the concentric grating rings have the same width.

16. The method of claim 9, wherein the concentric grating rings have different widths.

17. The method of claim 9, wherein the concentric grating rings comprises one or more of silicon (Si), gallium arsenide (GaAs), indium phosphide (InP), zirconium oxide (ZnO), titanium oxide ($TiO_2$), tantalum oxide ($Ta_2O_5$), hafnium oxide ($HfO_2$), aluminum oxide ($Al_2O_3$) and diamond.

18. The method of claim 17, wherein the regions of lower index of refraction material comprise one or more of silicon dioxide ($SiO_2$), polymethyl (meth)acrylate (PMMA) and air.

* * * * *